United States Patent [19]

Goss et al.

[11] Patent Number: 5,370,968
[45] Date of Patent: Dec. 6, 1994

[54] PHOTOCURABLE ELEMENTS HAVING TWO PHOTOCURABLE LAYERS

[75] Inventors: William K. Goss, Smyrna; Michael W. Yang, Marietta, both of Ga.

[73] Assignee: W.R. Grace & Co.-Conn., New York, N.Y.

[21] Appl. No.: 197,107

[22] Filed: Feb. 15, 1994

Related U.S. Application Data

[63] Continuation of Ser. No. 69,645, May 28, 1993, abandoned, which is a continuation of Ser. No. 681,671, Apr. 10, 1991, abandoned, which is a continuation-in-part of Ser. No. 514,825, Apr. 26, 1990, abandoned.

[51] Int. Cl.$^5$ .............................................. G03C 1/492
[52] U.S. Cl. ................................... 430/271; 430/273; 430/281; 430/286; 430/288; 430/300; 430/302; 430/306; 430/502
[58] Field of Search .............. 430/251, 286, 271, 273, 430/288, 300, 302, 306, 326, 502

[56] References Cited

U.S. PATENT DOCUMENTS

| | | | |
|---|---|---|---|
| 3,615,435 | 10/1991 | Chu et al. | 96/28 |
| 3,825,430 | 7/1974 | Kurka | 96/115 |
| 4,005,244 | 1/1977 | Wismer et al. | 428/480 |
| 4,045,231 | 8/1977 | Toda et al. | 96/115 |
| 4,179,531 | 12/1979 | Hein et al. | 430/300 |
| 4,186,069 | 1/1980 | Muzyczko et al. | 430/175 |
| 4,194,955 | 3/1980 | Nowak et al. | 204/159.15 |
| 4,248,960 | 2/1981 | Hein et al. | 430/306 |
| 4,264,705 | 5/1981 | Allen | 430/271 |
| 4,266,005 | 5/1981 | Nakamura et al. | 430/271 |
| 4,278,752 | 7/1981 | Gervay et al. | 430/281 |
| 4,294,905 | 10/1981 | Okishi et al. | 430/175 |
| 4,369,246 | 1/1983 | Chen et al. | 430/306 |
| 4,394,435 | 7/1983 | Farber et al. | 430/287 |
| 4,427,759 | 1/1984 | Gruetzmacher et al. | 430/273 |
| 4,564,580 | 1/1986 | Ichimura et al. | 430/281 |
| 4,957,850 | 9/1990 | Kusuda et al. | 430/271 |
| 4,970,134 | 11/1990 | Bronstert et al. | 430/271 |
| 4,994,344 | 2/1991 | Kurtz et al. | 430/271 |
| 5,001,036 | 3/1991 | Choi et al. | 430/271 |
| 5,006,447 | 4/1991 | Umeda et al. | 430/271 |

FOREIGN PATENT DOCUMENTS 1395822  5/1975  United Kingdom .

*Primary Examiner*—Jack P. Brammer
*Attorney, Agent, or Firm*—John J. Wasatonic; Craig K. Leon; William L. Baker

[57] ABSTRACT

Photocurable elements which are useful for preparing flexographic printing plates are provided which comprise a printing layer and a contiguous base layer, the printing layer comprising about 40 to 95 parts by weight of an elastomeric block copolymer, about 5 to 60 parts by weight of a second elastomeric polymer which is incompatible with the block copolymer, a photopolymerizable monomer, and a photoinitiator. The printing layer preferably also comprises an actinic radiation scattering and absorbing pigment.

Also provided are relief printing plates prepared from the photocurable elements. The printing plates have a tack-free surface having excellent ink transfer properties, abrasion resistance, and solvent resistance. A high level of exposure latitude may also be provided in the photocurable elements of the invention.

18 Claims, No Drawings

PHOTOCURABLE ELEMENTS HAVING TWO PHOTOCURABLE LAYERS

This is a continuation of co-pending application Ser. No. 08/069,645 filed May 28, 1993, now abandoned which was a file wrapper continuation of application Ser. No. 07/681,671 filed on Apr. 10, 1991, now abandoned which is a continuation-in-part of application Ser. No. 07/514,825, filed on Apr. 26, 1990, now abandoned.

This application is a continuation-in-part of U.S. application Ser. No. 07/514,825, filed Apr. 26, 1990.

This invention is directed to multi-layer photocurable elements intended primarily for use in the preparation of flexographic relief printing plates and to the relief image printing plates prepared from such elements.

In the preparation of relief printing plates from negative-working photocurable elements, at least one layer of a negative-working photocurable composition is exposed through an image-bearing transparency to radiation of an appropriate wave length to cure or harden the composition. The photocurable composition is initially soluble in a chosen developer solvent and becomes insoluble as a result of photocuring. Development of the exposed layer(s) thus removes the composition in non-exposed areas, leaving a relief image comprised of the cured composition.

The photocurable composition is generally disposed on a suitable support to which the relief image remains adhered after development. It is often preferred to provide two or more layers of different photocurable compositions on the support. The layers are generally coextensive and contiguous, i.e., in contact with one another at their interface, and are photoexposed and developed simultaneously, i.e., a single imagewise exposure is used and all layers are developed at the same time using a common developer solvent treatment. The use of multiple layers, usually two layers, often provides improved physical properties and printing characteristics. Thus, the base layer, i.e., that closest to the support, can be formed of a composition which is readily deformable and resilient in the cured state to provide greater conformity of the plate to the surface to be printed and provide a more even impression. On the other hand, the upper layer, which provides the printing surface, can be specifically adapted to provide improved printing characteristics such as ink take-up and lay-down, abrasion resistance, solvent resistance, and hardness.

This invention is directed toward such multi-layer elements wherein the upper or printing layer is comprised of a certain combination of different elastomeric polymer materials in combination with one more photopolymerizable monomers and photoinitiators. More specifically, the invention is directed to multi-layer photocurable elements comprising first and second photocurable layers, tile first photocurable layer (hereinafter the "printing layer") comprising a certain combination of incompatible elastomeric polymeric materials, at least one photopolymerizable monomer, and a photoinitiator, and the second photocurable layer comprised of a photocurable composition which is different from that of the printing layer. The printing layer is on and contiguous with the base layer and the layers are generally coextensive. It is preferred that the base layer, after photocuring is more readily deformed than the printing layer. The elements of this invention preferably also comprise a support layer disposed on the side of the base layer opposite the printing layer. Generally, the base layer is in direct contact with the support, i.e., without any intervening layers, although an adhesive coating may be used better secure that base layer to the support.

It has been found that the incompatible elastomeric polymer system of the printing layer provides, after photocuring, a tack-free printing surface having substantially improved ink transfer and cleaner printing characteristics. A particularly desirable advantage provided by the cured printing layer is a substantial improvement in the uniformity of the ink lay-down or, conversely, a substantially less mottled appearance in the printing image. Surprisingly, despite the incompatibility of the elastomeric polymers, the surface of the cured printing layer is substantially smooth with no significant deformation, roughness, or pin-hole appearance. The improved ink transfer attained with this smooth surface is surprising, and may be contrasted with the conventional plates in which a toughened surface is provided for improving ink transfer. In a particularly preferred embodiment, the printing layer further comprises a pigment material which is capable of scattering and absorbing significant amounts of the actinic radiation used for photocuring. The pigment provides additional improvements in exposure latitude and dot gain, and gives a contrast relief image which can be more easily inspected to determine the overall quality of the relief image.

The incompatible polymer system used in the printing layer comprises (1) about 40 to 95 parts by weight of a photocrosslinkable elastomeric block copolymer and (2) about 5 to 60 parts by weight of a second elastomeric polymer component which is incompatible with the elastomeric block copolymer and is selected from the group consisting of acrylonitrile/butadiene copolymers, e.g., HYCAR VT-330 available from Zeon Chemicals; acrylonitrile/butadiene/styrene copolymers, e.g., Dow Magnum 343 available from the Dow Chemical Co.; methylmethacrylate/acrylonitrile/butadiene/styrene copolymers, e.g., Blendex 491 available from the General Electric Specialty Chemicals Co.; acrylonitrile/isoprene copolymers; carboxylated acrylonitrile polymers; acrylate polymers, e.g., HyTemp 4053 EP available from Zeon Chemicals; and mixtures of the same. Within these weight ranges, it has been found that the respective polymer components can be made incompatible, as further described hereinafter, so as to provide the improved printing properties of the invention. This mixture (1) and (2) of incompatible polymers is incorporated into the photocurable composition which is used to form the printing layer of the elements of this invention. In a preferred embodiment the incompatible polymer system comprises about 50 to 80 parts of component (1) and about 20 to 50 parts of component (2). The photocurable composition further comprises a photopolymerizable monomer, preferably an acrylic monomer, e.g., 1,6-hexanediol diacrylate, 1,6-hexanediol dimethacrylate, trimethyolpropane triacrylate, trimethyolpropane trimethacrylate, or mixtures such monomers; and a free radical photoinitiator, e.g., benzophenone, 4,4'-bis(-dimethylamino) benzophenone, benzildimethylacetal, benzoin, benzoin ethers, 2,2-dimethoxy-2-phenylacetophenone, and 4-methoxy-4'-dimethylamino benzophenone. The composition preferably contains about 5 to 40 parts by weight of the photopolymerizable monomer(s) and about 0.05 to 2 parts by weight of the photoinitiator. The composition may also contain other additives which are known in the art for use in photocurable compositions, e.g., antioxidants, antiozonants, and UV absorbers.

The elastomeric block copolymer used in the incompatible polymer system can be any of the photocrosslinkable block copolymers known for rise in the preparation of flexographic printing plates. The preferred materials are the ABA block copolymers wherein each A is a non-elastomeric polymer block and each B is an elastomeric polymer block. Typical ABA block copolymers which can be used in this invention are polystyrene-polybutadiene-polystyrene and polystyrene-polyisoprene-polystyrene. The latter block copolymer is preferred and is available from Shell Oil Co. under the tradename "Kraton".

The second elastomeric polymer component of the printing layer is incompatible with the block copolymer component. The term "incompatible" means that the second elastomeric polymer is present in at least the photocured printing layer in discreet "islands" or "domains", comprised principally of the second elastomeric polymer. These polymer domains are physically distinct from the surrounding block copolymer in that they have discernible boundary regions which form an interface between the second elastomeric polymer domain and the surrounding block copolymer. At least in those systems in which the block copolymer is present in greater amount than the second elastomeric polymer, these polymer domains may be viewed as a discontinuous phase dispersed throughout a continuous phase (or matrix) of the block copolymer. The incompatible polymer domains are most importantly provided at the surface of the printing layer and these domains are believed to be principally responsible for the improved printing properties of the relief printing plates of the invention. Preferably, the polymer domains have a maximum dimension of 5 microns, more preferably 0.5 to 2.5 microns. The domains should be near regularly shaped and uniformly dispersed throughout the block copolymer matrix.

The block copolymer and second elastomeric polymer component may also be, and generally are, incompatible as described above prior to curing of the printing layer.

The polymer or polymers used as the second elastomeric polymer component preferably have a molecular weight of at least about 20,000, and more preferably at least about 50,000. A preferred molecular weight range is about 50,000 to 300,000. As used herein, "molecular weight" means number average molecular weight as measured by gel permeation chromatography using a suitable solvent for the polymer, e.g., tetrahydrofuran or N,N-dimethylformamide, and polyacrylic acid, polystyrene, or polyethylene oxide as a standard.

More than one elastomeric polymer which is incompatible with the elastomeric block copolymer may be used in the printing layer. A preferred combination of such polymers is a mix of acrylonitrile/butadiene and acrylonitrile/butadiene/styrene or methylmethacrylate/acrylonitrile/butadiene/styrene copolymers wherein the acrylonitrile/butadiene copolymer comprises at least 50% by weight of the mix. Preferably, each of these polymers has a molecular weight of at least about 20,000, more preferably at least about 50,000.

The photocurable composition used to prepare the printing layer may be formed by dissolving or dispersing the block copolymer and incompatible elastomeric polymer in a suitable solvent or mixture of solvents, together with desired amounts of photopolymerizable monomer, photoinitiator, and other additives. Heating or high shear mixing may be required to effect proper dissolution or dispersion. The resulting solution or dispersion may then be coated onto a preformed photocurable base layer to provide the printing layer. Alternatively, the solution or dispersion may be coated onto a cover sheet element and dried, and the resultant printing layer laminated to a preformed photocurable base layer using heat and/or pressure. In another alternative, the base layer may be coated or extruded onto the printing layer, the printing layer having been previously coated onto a cover sheet and dried as described above. The printing layer may be coated using, for example, extrusion die coating or roller coating methods.

The use of the above-described combination of acrylonitrile/butadiene and acrylonitrile/butadiene/styrene copolymers, in which at least 50% by weight is the acrylonitrile/butadiene copolymer, as the incompatible polymer component has been found to provide dispersions having superior stability and particle size. Dispersions prepared using this preferred combination of incompatible polymers in conjunction with the elastomeric block copolymer have a relatively uniform and desirably small particle size of less than 5 microns, and maintain this uniformly low particle size for appreciable longer periods of time than, say, dispersions containing only the acrylonitrile/butadiene copolymer and the elastomeric block copolymer. It is believed that in these dispersions the elastomeric block copolymer is dissolved while the dispersed particles comprise one or both of the incompatible elastomeric copolymers. Thus, the preferred mix of incompatible polymers has been found to inhibit the growth in size of the dispersed incompatible polymers and delay any coagulation of the particles. One is thus able to more readily coat a printing layer having the preferred incompatible polymer domains.

It is generally preferred to dry the coated printing layer composition prior to contact with the base layer. Where the coating composition is a solution, the evaporation of the solvent from the coated printing layer will usually result in phase separation of the block copolymer and second elastomeric polymer, resulting in the above mentioned discreet domains of the second elastomeric polymer. With both the solution and dispersion coating compositions, the drying conditions can be determined by simple experimentation and determination of the domain size and shape microscopically, so as to balance the domain nucleation rate versus the domain growth rate to achieve a desired size range and domain shape. In one preferred embodiment, a multi-temperature zone drying oven is used wherein each zone through which the coating is passed has a successively higher temperature.

The printing layer may also be formed by coating a heated, liquified mixture of the block copolymer, second elastomeric polymer, photopolymerizable monomer, photoinitiator and optional additives onto a base layer or onto a support as described above. These mixes contain little or no solvent. Cooling of the applied coating generally results in the phase separation of the incompatible polymers, as discussed above. As with the drying of the solvent-based compositions, the cooling temperatures and the rate of cooling may be experimentally determined so as to provide the desired balance between domain nucleation rate and domain growth rate, thereby achieving the desired domain size and shape.

The specific relative amounts of block copolymer and second elastomeric polymer will depend on the particular polymers and should be chosen, within the above-described ranges of the invention, so as to provide the desired incompatible polymer domains.

The block copolymer and the second elastomeric polymer component, in the cured printing layer, should differ in compressibility, resilience, or modulus. The respective polymers may differ in one or more of these properties. In general, the predominant polymer component should have a higher compressibility and/or resilience, and/or a lower modulus.

As noted above, the printing layer preferably also contains an actinic radiation-scattering and absorbing pigment. The pigment is substantially insoluble in the photocurable composition of the printing layer, should be substantially opaque to the actinic radiation, and should reduce the photosensitivity of the printing layer to the radiation. Any such pigment may be used which is compatible with and dispersible in the photocurable composition. Illustrative of such pigments are phthalocyanine pigments; cadmium based pigments; and mercuric oxide pigments. Phthalocyanine pigments are preferred, inclusive of phthalo red, phthalo blue, and phthalo green pigments.

The printing layer is disposed on a photocurable base layer which, in general, is in turn supported by a suitable sheet support element. The base layer may be formed from a photocurable composition which is the same as that of the printing layer, but without the incompatible second elastomeric polymer or any pigment. Alternatively, the photocurable composition used in the base layer may be different from the photocurable composition which is utilized in the printing layer. In most applications it is preferred to utilize different photocurable compositions for the respective base and printing layers in order to make one of such layers harder or softer than the other, to provide an optimal ink receptivity or lay-down in the printing layer, or to provide other variances in properties between the respective layers.

The base layer preferably comprises an elastomeric block copolymer, which may be the same as or different than the elastomeric block copolymer of the printing layer, and one or more photopolymerizable monomers. The elastomeric block copolymer is preferably photocrosslinkable and thus undergoes photoinduced curing or hardening. Alternatively, the elastomeric block copolymer can be inert and function as a binder in the base layer. In this latter embodiment, photocuring is effected by photopolymerization of the monomer(s) present in the base layer. The photopolymerizable monomers of the base layer may also be the same as or different from those of the printing layer. The base layer also contains a photoinitiator and this may also be the same as or different from that of the printing layer. The base layer may also contain stabilizers, antiozonites, antioxidants, and other additives known for use in photocurable layers.

The thickness of the printing layer may suitably be on the order of from about 0.001 to about 0.010 inch, preferably on the order of from about 0.002 to about 0.008 inch, such thickness being independent of the thickness of the base layer (and photocurable element per se). It will be recognized, however, that depending on the specific composition of the layers, other thicknesses may be utilized to advantage, as may readily be determined by simple experimentation and measurement of the photocured element characteristics and properties.

The support member of the photocurable element is suitably formed from any natural or synthetic material capable of forming a flexible or rigid film or sheet. In applications such as flexographic printing, where the photocurable element is used as a printing plate, the support member may be a metal sheet of a material such as steel or tin coated steel, or alternatively may be a plastic film of a material such as polyester or polyamine. The support member may function as a substrate during formation of the base layer, or the support member may be joined, as by lamination under heat and/or pressure to the base layer/printing layer composite, after formation of the latter.

In other instances, the photocurable element comprising the base layer and printing layer may possess sufficient mechanical strength and structural integrity to be self-supporting in character, so that a separate support member is not required. When a support member is utilized, it is preferably dimensionally stable and resistant to the radiation treatment and further processing steps for the photocurable element, i.e., in the case of photocurable elements which are processed subsequent to radiation exposure by aqueous or solvent-based washing systems, the substrate is resistant to the washing medium.

The photocurable elements of the invention are exposed imagewise to actinic radiation, usually ultraviolet radiation, for a sufficient period of time to satisfactorily cure both the printing and base layers. Imagewise exposure is effected through the printing layer, i.e., the printing layer is closest to the radiation source. The photocurable element may optionally be exposed from the opposite side, either in a non-imagewise manner to provide a "floor" for the relief image, or in an imagewise manner, e.g., as disclosed in U.S. Pat. No. 4,927,723.

On completion of exposure, the element is processed for development of the relief image by washing with a suitable solvent. Conventional solvent systems may be used and, depending on the composition of the photocurable layers, these may be organic or aqueous-based solvents. The washing step removes the unexposed sections of both the printing and base layers, without substantial removal of exposed sections, thus providing a multi-layer relief image. Aqueous-based developer solvents include aqueous basic solutions, with or without surfactants, e.g., sodium carbonate or sodium hydroxide solutions. Organic solvents which can be used include limonene-based solvent systems, perchloroethylene/butanol, trichloroethane, trichloroethylene/butanol, aromatic and aliphatic hydrocarbons, etc., and mixtures of the foregoing.

After washing, the relief plate may be dried, e.g., in a forced hot air oven. The element may then be given a second overall post-exposure to further cure the relief image. The present invention is further described by the following Example, which is non-limiting and illustrative only. In the following Example, all parts and percentages are by weight, unless otherwise stated.

EXAMPLE

A coating composition for use in forming a photocurable printing layer of the invention was prepared by mixing 240 parts of toluene, 80 parts of methyl ethyl ketone, 80 parts of a polystyrene-polyisoprene-polystyrene block copolymer (Kraton 1107 from Shell Oil Co.), 20 parts of an acrylonitrile/butadiene copolymer (Hycar VT 330 from Zeon Chemicals Inc.), 13.3 parts of an acrylonitrile/butadiene/styrene copolymer (Dow Magnum 343), 6.8 parts of 1,6-hexanedioldiacrylate (1,6-HDDA), 4.5 parts of 1,6-hexanedioldimethacrylate (1,6-HDDMA), 1.5 parts of a free radical initiator (Irgacure 651, available from Ciba Geigy), 1.5 parts of 2,6-di-t-butylparacresol, 2.3 parts of Daniel AL-703 (a green phthalocyanine pigment available from Daniel Products, Jersey City, N.J.), and 0.023 parts of Tinuvin 1130 ultraviolets absorber, available from Ciba-Geigy. The resulting mix was stirred using a high shear mixer for several hours at 50° C. to attain a uniform dispersion. The dispersion was then extrusion die coated onto a 5 mil polyester cover sheet and oven dried in a variable temperature zone oven wherein each successive zone used for drying had a higher temperature than the previous zone. The resultant printing layer had a thickness of about 2.5 mils. The polyester cover sheet had been previously coated with a 0.25 mil polyamide slip film of a type well known in the art and the printing layer was coated onto the slip film.

A coating composition for use in preparing a photocurable base layer was prepared by mixing 210 parts of Kraton 1107, 9.5 parts of HDDA, 7.4 parts of HDDMA, 3.4 parts of Irgacure 651, 3.4 parts of 2,6-di-t-butylparacresol, 0.42 parts of calcium stearate, 1.6 parts of an antiozonant paraffinic wax, 10.5 parts of a depolymerized polyisoprene, 0.044 parts of Tinuvin 1130, and 0.1 parts of an antioxidant (Irganox 1010 available from Ciba Geigy). The resultant mix was extruded at a temperature between 240° F. and 260° F. onto the printing layer to an approximate thickness of 70 mils, cooled, and ground down to provide a final total element thickness of approximately 66 mils. A 5 mil polyester support film having a 1 mil hot melt adhesive layer on one surface was then laminated to the exposed face of the base layer under the influence of heat and pressure.

For photoexposure, the element was exposed through the transparent support in a non-imagewise manner for about 12 seconds. The cover sheet was then stripped from the element leaving the polyamide film on the printing layer. A negative transparency was placed on the polyamide film and the element exposed through the negative to ultraviolet radiation for about 10 minutes. The lamp intensity for both exposures was 20-24 milliwatts/cm$^2$. The exposed plate was developed using a 75% perchloroethylene/25% butanol developer solvent, dried, and post-exposed simultaneously with germicidal and exposure lamps for about 10 minutes. The resultant relief printing plate displayed excellent ink transfer properties, particularly with regard to the uniformity of the applied ink, and abrasion resistance, and produced clear, very high quality printing impressions. The printing surface of the plate was smooth and tack-free.

In order to demonstrate enhanced exposure latitude, a second such element was exposed imagewise for 20 minutes, and developed as disclosed above. The resultant relief image was approximately equivalent to that of the element exposed for 10 minutes and, in particular, the reverse depths of the plates were approximately equal with respect to printability.

What is claimed is:

1. A photocurable element comprising a photocurable base layer and a contiguous second photocurable layer operative when cured to provide a printing layer; said second photocurable layer comprising about 40 to 95 parts by weight of an elastomeric block copolymer and about 5 to 60 parts by weight of a second elastomeric polymer which is incompatible with and dispersed within said block copolymer, said second elastomeric polymer being operative, when said second photocurable layer is photocured, to form discreet and uniformly distributed domains having a maximum dimension of 5 microns, said polymer domains constituting a discontinuous phase dispersed throughout a continuous phase of said block copolymer, said second photocurable layer further comprising a polymerizable monomer, and a photoinitiator, said second elastomeric polymer being selected from the group consisting of acrylonitrile/butadiene copolymers, acrylonitrile/isoprene copolymers, carboxylated acrylonitrile polymers, acrylate polymers, and mixtures of the same; said photocurable base layer comprising an elastomeric polymer, a photopolymerizable monomer, and a photoinitiator.

2. An element of claim 1 further comprising a support layer disposed on the side of the base layer opposite the printing layer.

3. An element of claim 1 wherein said printing layer comprises about 50 to 80 parts of said block copolymer and about 20 to 50 parts of said second elastomeric polymer.

4. An element of claim 1 wherein said elastomeric block copolymer is an ABA block copolymer and said second elastomeric polymer is an acrylonitrile/butadiene copolymer.

5. An element of claim 4 wherein said ABA block copolymer is a Polystyrene-polyisoprene-polystyrene or polystyrene-polybutadiene-polystyrene.

6. An element of claim 1 wherein said second elastomeric polymer is an acrylonitrile/butadiene copolymer and said printing layer further comprises an acrylonitrile/butadiene/styrene copolymer or a methylmethacrylate/acrylonitrile/butadiene/styrene copolymer which is incompatible with said block copolymer.

7. An element of claim 6 wherein said acrylonitrile/butadiene copolymer comprises greater than 50% of the total weight of said acrylonitrile/butadiene copolymer and said acrylonitrile/butadiene/styrene or methylmethacrylate/acrylonitrile/butadiene/styrene copolymer.

8. An element of claim 1 wherein said elastomeric block copolymer in said printing layer is photocross linkable.

9. An element of claim 1 wherein said elastomeric polymer in said base layer is the same as the elastomeric block copolymer in said printing layer.

10. An element of claim 1 wherein said elastomeric block copolymer is a photocrosslinkable ABA block copolymer.

11. An element of claim 1 wherein said printing layer further comprises a radiation scattering and absorbing pigment which reduces the photosensitivity of said printing layer to the radiation.

12. An element of claim 11 wherein said printing layer comprises from about 1 to 10 parts by weight of said pigment.

13. An element of claim 11 wherein said pigment is a phthalocyanine pigment.

14. An element of claim 1 wherein said printing layer comprises about 5 to 40 parts by weight of said photopolymerizable monomer and about 0.05 to 3 parts by weight of said photoinitiator.

15. An element of claim 1 wherein polymer domains formed by said incompatible second elastomeric polymer have a maximum dimension of less than about 5 microns.

16. An element of claim 15 wherein said polymer domains have a maximum dimension in the range of about 0.5 to 2.5 microns.

17. An element of 1 wherein said second elastomeric polymer has a molecular weight greater than about 20,000.

18. An element of claim 6 wherein said acrylonitrile/butadiene, acrylonitrile/butadiene/styrene, and methylmethacrylate/acrylonitrile/butadiene/styrene copolymers each have a molecular weight greater than about 20,000.

* * * * *